US012761275B2

(12) United States Patent
Wang et al.

(10) Patent No.: US 12,761,275 B2
(45) Date of Patent: Oct. 13, 2026

(54) METHOD FOR PERFORMING MULTIPLE CIRCUIT TESTS WITH MULTIPLE INSTRUMENTS AND METHOD FOR CREATING GENERAL FORM FILE CONFORMING TO GENERAL FORM APPLICABLE TO MULTIPLE INSTRUMENTS

(71) Applicant: REALTEK SEMICONDUCTOR CORPORATION, Hsinchu (TW)

(72) Inventors: Chung-Yi Wang, Hsinchu (TW); Chia-Che Wu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 403 days.

(21) Appl. No.: 18/388,545

(22) Filed: Nov. 10, 2023

(65) Prior Publication Data

US 2024/0159826 A1 May 16, 2024

(30) Foreign Application Priority Data

Nov. 15, 2022 (TW) .................................. 111143496

(51) Int. Cl.
*G01R 31/317* (2006.01)

(52) U.S. Cl.
CPC .............................. *G01R 31/31718* (2013.01)

(58) Field of Classification Search
CPC ........ G01R 31/31718; G01R 31/31907; G01R 31/31707
See application file for complete search history.

(56) References Cited

U.S. PATENT DOCUMENTS

| | | | | |
|---|---|---|---|---|
| 9,791,506 B1 * | 10/2017 | Meidan | G01R 31/31907 | |
| 11,169,203 B1 * | 11/2021 | Kramer | G06Q 10/06315 | |
| 2008/0059838 A1 * | 3/2008 | Melman | G01R 31/31912 | 714/25 |
| 2009/0112505 A1 * | 4/2009 | Engel | G01D 21/00 | 702/123 |
| 2017/0343601 A1 * | 11/2017 | Casatuta | G01R 31/31707 | |

* cited by examiner

*Primary Examiner* — Ricky Go
(74) *Attorney, Agent, or Firm* — WPAT, PC

(57) ABSTRACT

An automated test mechanism includes: preparing test software capable of reading and processing a file in a general form, and making the test software support N kinds of communication interfaces, M kinds of communication protocols, and multiple commands of K kinds of instruments, wherein the general form includes an interface setting part, a communication protocol setting part, and a function list part; creating multiple general form files in the general form to support the K kinds of instruments, wherein the multiple general form files include a first file and a second file that are prepared for a first instrument and a second instrument of the multiple instruments respectively; and when performing a first test with the first instrument, choosing the first file for the first test, and when performing a second test with the second instrument, choosing the second file for the second test.

10 Claims, 5 Drawing Sheets

METHOD FOR PERFORMING MULTIPLE CIRCUIT TESTS WITH MULTIPLE INSTRUMENTS AND METHOD FOR CREATING GENERAL FORM FILE CONFORMING TO GENERAL FORM APPLICABLE TO MULTIPLE INSTRUMENTS

BACKGROUND OF THE INVENTION

1. Field of the Invention

The present disclosure relates to a method for performing circuit tests and a method for creating a file, especially to a method for performing multiple circuit tests with multiple instruments and a method for creating a general form file conforming to a general form applicable to the multiple instruments.

2. Description of Related Art

A circuit test is usually performed with an instrument executing test software. Different instruments are usually suitable for different kinds of circuit interfaces and different kinds of communication protocols, respectively. Generally, one test software is dedicated to one instrument instead of multiple instruments. In order to perform multiple circuit tests with multiple instruments, respectively, multiple test software should be developed; in other words, N kinds of test software should be developed for N kinds of instruments respectively, and this takes a lot of development time. In addition, different kinds of test software have their respective user interfaces, and this raises difficulties for a user becoming practiced with the test software.

SUMMARY OF THE INVENTION

An object of the present disclosure is to provide a method for performing multiple circuit tests with multiple instruments and a method for creating a general form file conforming to a general form applicable to the multiple instruments and thereby prevent the problems of the prior art.

An embodiment of the method for performing multiple circuit tests with multiple instruments includes the following steps: preparing test software for reading and processing a file conforming to a general form, and preparing the test software for supporting N kinds of communication interfaces of K kinds of instruments, M kinds of communication protocols, and multiple commands executable by the K kinds of instruments, wherein the general form includes a part for interface setting, a part for communication protocol setting, and a function list part, and each of the N, the K, and the M is an integer greater than one; creating multiple general form files conforming to the general form to support the K kinds of instruments, wherein a first file of the multiple general form files is applicable to a first instrument of the K kinds of instruments and a second file of the multiple general form files is applicable to a second instrument of the K kinds of instruments; and when performing a first circuit test of the multiple circuit tests with the first instrument, using the test software to choose the first file for the first circuit test, and when performing a second circuit test of the multiple circuit tests with the second instrument, using the test software to choose the second file for the second circuit test.

Another embodiment of the method for performing multiple circuit tests with multiple instruments includes the following steps: preparing test software for reading and processing a file conforming to a general form, and preparing the test software for supporting N kinds of communication interfaces of K kinds of instruments, M kinds of communication protocols, and multiple commands executable by the K kinds of instruments, wherein the general form includes a part for interface setting and a part for communication protocol setting, and each of the N, the K, and the M is an integer greater than one; creating multiple general form files conforming to the general form to support the K kinds of instruments, wherein a first file of the multiple general form files is applicable to a first instrument of the K kinds of instruments and a second file of the multiple general form files is applicable to a second instrument of the K kinds of instruments; and when performing a first circuit test of the multiple circuit tests with the first instrument, using the test software to choose the first file and select at least one of multiple commands of the first instrument for the first circuit test, and when performing a second circuit test of the multiple circuit tests with the second instrument, using the test software to choose the second file and select at least one of multiple commands of the second instrument for the second circuit test.

An embodiment of the method for creating a general form file conforming to a general form applicable to multiple instruments includes the features: the general form file is for being read and processed by test software which supports N kinds of communication interfaces of K kinds of instruments, M kinds of communication protocols, and multiple commands executable by the K kinds of instruments; the general form file is used for supporting a target instrument of the K kinds of instruments, a target interface of the N kinds of communication interfaces, a target protocol of the M kinds of communication protocols, and a target function of the target instrument, wherein each of the N, the K, and the M is an integer greater than one; and the general form includes a part for interface setting, a part for communication protocol setting, and a function list part. The embodiment also includes the following steps: filling in an instrument filed of the general form with a name of the target instrument, choosing the target interface from an interface menu of the general form, and determining at least one role of the target instrument with a role menu of the general form, and thereby accomplishing the part for interface setting of the general form of the general form file, wherein communication setting required by the interface menu is accessible by a user interface of the test software; when a protocol menu of the general form includes the target protocol, choosing the target protocol from the protocol menu and thereby accomplishing the part for communication protocol setting of the general form of the general form file, wherein the protocol menu is accessible by the user interface; and when the protocol menu does not include the target protocol, adding the target protocol to a protocol page of the general form file and then choosing the target protocol from the protocol menu; and choosing at least one of one or more command(s) executable by the target instrument from a command menu of the general form and thereby accomplishing the function list part of the general form of the general form file, wherein the command menu is accessible by the user interface and the function list part of the general form file is associated with the target function.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses a method for performing multiple circuit tests with multiple instruments (hereinafter referred to as "circuit test method") and a method for creating a general form file conforming to a general form applicable to the multiple instruments. The methods of the present disclosure can save the total time for the development of test software applicable to multiple kinds of instruments and can allow a user to operate the multiple kinds of instruments with the same test software.

Figure 1:
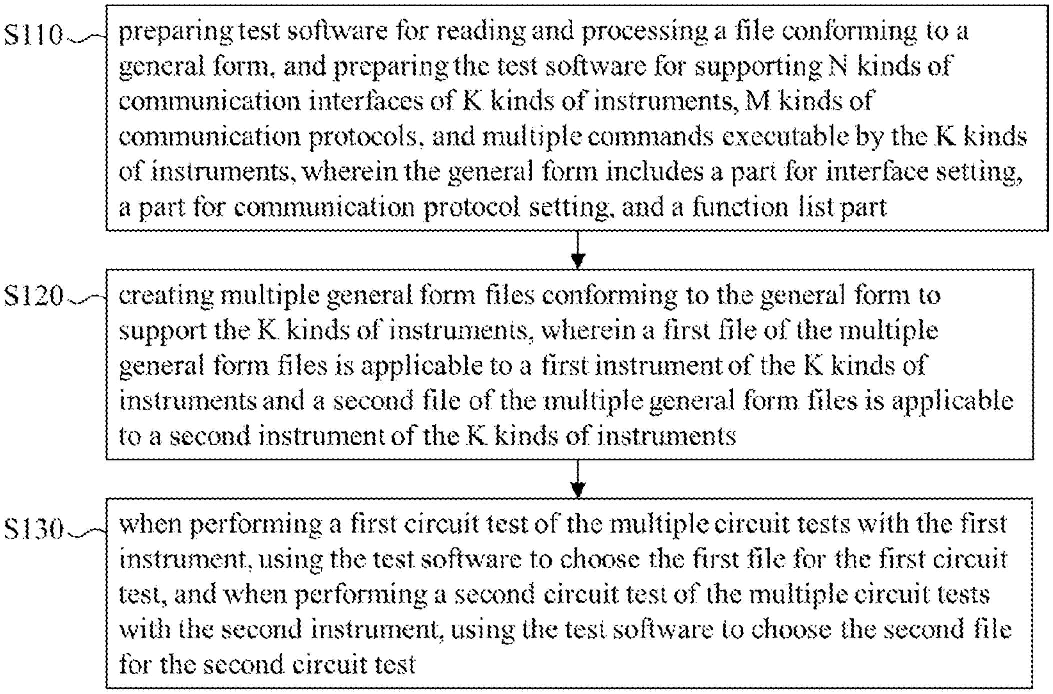
FIG. 1 shows an embodiment of the method of the present disclosure for performing multiple circuit tests with multiple instruments.

FIG. 1 shows an embodiment of the circuit test method of the present disclosure. The embodiment of FIG. 1 includes the following steps:

S110: preparing test software for reading and processing a file conforming to a general form, and preparing the test software for supporting N kinds of communication interfaces of K kinds of instruments, M kinds of communication protocols, and multiple commands executable by the K kinds of instruments, wherein the general form includes a part for interface setting, a part for communication protocol setting, and a function list part, and each of the N, the K, and the M is an integer greater than one.

In an exemplary implementation, the K is equal to or greater than each of the N and the M.

It is noted that the circuit test method of the present disclosure puts emphasis on the scheme of the general form readable by the test software and applicable to multiple instruments rather than the development of the test software. The development of the test software, which can be run by a specific instrument, can be realized with a datasheet of the specific instrument and known software development tools, and the detail of the software development falls beyond the scope of the present disclosure.

S120: creating multiple general form files conforming to the general form to support the K kinds of instruments, wherein a first file of the multiple general form files is applicable to a first instrument of the K kinds of instruments and a second file of the multiple general form files is applicable to a second instrument of the K kinds of instruments.

S130: when performing a first circuit test of the multiple circuit tests with the first instrument, using the test software to choose the first file for the first circuit test, and when performing a second circuit test of the multiple circuit tests with the second instrument, using the test software to choose the second file for the second circuit test.

Figure 2:
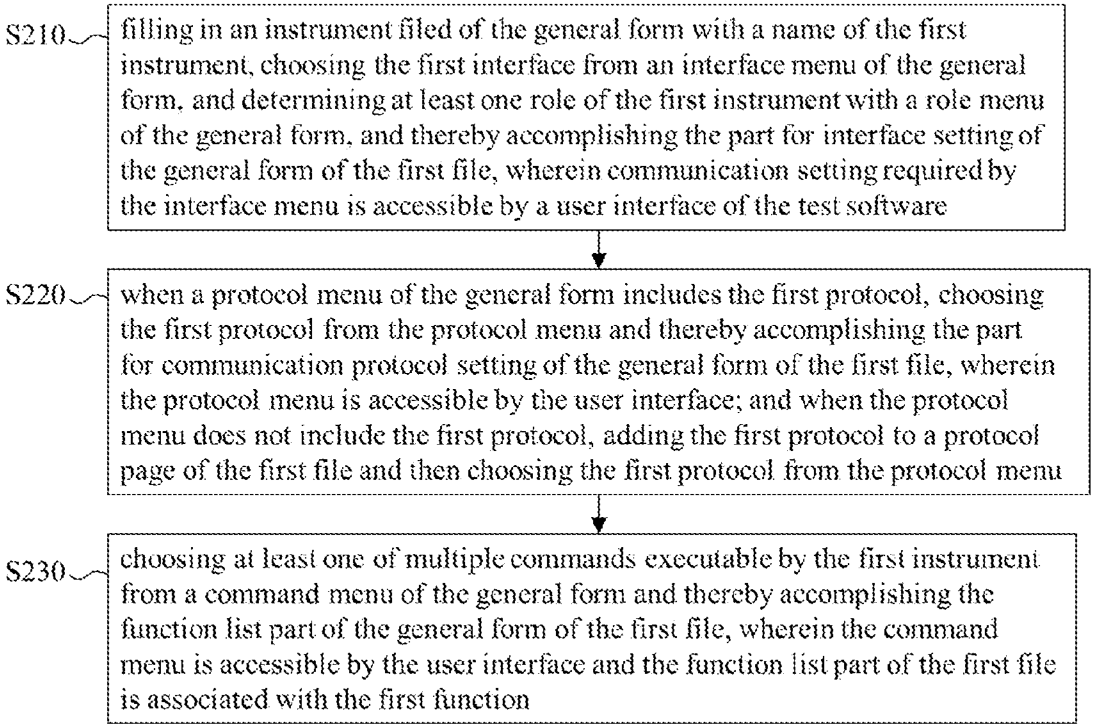
FIG. 2 shows an exemplary implementation for creating a general form file of the embodiment of FIG. 1.

In an exemplary implementation of the embodiment of FIG. 1, the first file is applicable to the first instrument, wherein the first instrument has a first interface of the N kinds of communication interfaces, uses a first protocol of the M kinds of communication protocols, and is capable of executing a first function. FIG. 2 shows the steps for creating the first file, the steps including:

S210: filling in an instrument filed of the general form with a name of the first instrument, choosing the first interface (e.g., Ethernet Interface (ETN), Universal Asynchronous Receiver/Transmitter (UART), General Purpose Interface Bus (GPIB), Recommend Standard number 232 (RS232), or Universal Serial Bus (USB)) from an interface menu of the general form, and determining at least one role of the first instrument with a role menu of the general form, and thereby accomplishing the part for interface setting of the general form of the first file, wherein communication setting required by the interface menu is accessible by a user interface of the test software.

An embodiment of the part for interface setting of the general form is illustrated with Table 1 below, wherein the annotations in the brackets are for a better understanding of the embodiment and can be omitted.

TABLE 1

| Device | Interface | Function (role menu) | |
|---|---|---|---|
| (instrument filed) | (interface menu) | Scan (scan terminal) | Compare (compare terminal) |
| QD980 ( first instrument ) (the name of this instrument is editable by the user) | ETN | ✓ (the first instrument functions as a scan terminal) | ✓ (the first instrument functions as a compare terminal) |

S220: when a protocol menu of the general form includes the first protocol, choosing the first protocol (e.g., Standard Commands for Programmable Instruments (SCPI) or Transmission Control Protocol/Internet Protocol (TCP/IP)) from the protocol menu and thereby accomplishing the part for communication protocol setting of the general form of the first file, wherein the protocol menu is accessible by the user interface; and when the protocol menu does not include the first protocol, adding the first protocol to a protocol page of the first file and then choosing the first protocol from the protocol menu.

An embodiment of the part for communication protocol setting of the general form is illustrated with Table 2 below, wherein the annotations in the brackets are for a better understanding of the embodiment and can be omitted. It is noted that one instrument may support one or more protocols.

TABLE 2

| Protocol Name | Format | Note |
|---|---|---|
| SCPI | [Command]:[Sub-command][Parameter][End] | a semicolon in the end is used for connecting and differentiating two commands |

S230: choosing at least one of multiple commands (e.g., Loads a format (FMTL), Sets the sampling mode (DVSM), XVSI, IMGL, NBPC, and FMTU) executable by the first instrument from a command menu of the general form and thereby accomplishing the function list part of the general form of the first file, wherein the command menu is accessible by the user interface and the function list part of the first file is associated with the first function.

An embodiment of the function list part of the general form is illustrated with Table 3 below, wherein the annotations in the brackets are for a better understanding of the embodiment and can be omitted.

executable by the K kinds of instruments, wherein the general form includes a part for interface setting and a part for communication protocol setting, and each of the N, the K, and the M is an integer greater than one.

S420: creating multiple general form files conforming to the general form to support the K kinds of instruments, wherein a first file of the multiple general form files is appliable to a first instrument of the K kinds of instruments and a second file of the multiple general form files is applicable to a second instrument of the K kinds of instruments.

TABLE 3

| Check (ticking the checkbox of the function to be executed) | Function Name | Function List | Command | Sub-command | Parameter | End (ending symbol) | Delay(Sec) | Note |
|---|---|---|---|---|---|---|---|---|
| ✓ | 4K60/ColorBar pattern (image of 4K resolution and 60 frame rate/Color Bar pattern) | 1 | OUT10 | FMTL | 2160p60.xml | ; | | Image Format (image resolution) |
| | | | OUT10 | DVST | 10 | ; | | Signal type |
| | | | OUT10 | XVSI | 4 | ; | | Video interface |
| | | | OUT10 | IMGL | ColorBar | ; | | Image |
| | | | OUT10 | NBPC | 8 | ; | 2 | Bit depth |
| | | | OUT10 | FMTU | | | | to use the currently loaded format |

Figure 3:
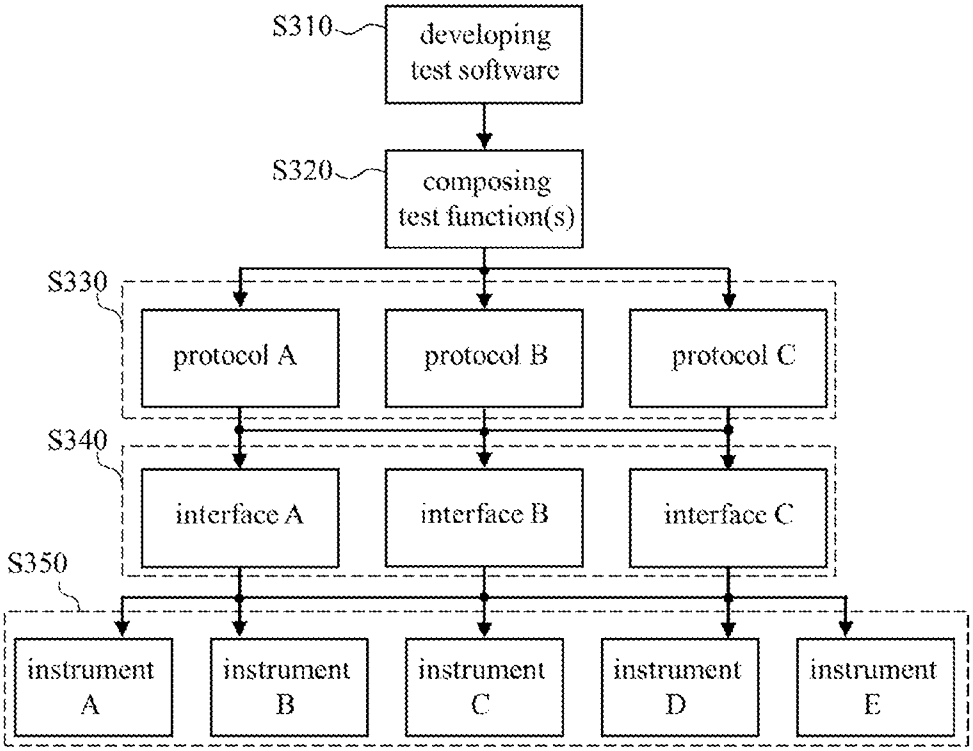
FIG. 3 shows a flow chart of an exemplary development for the understanding of the embodiment of FIG. 1.

FIG. 3 shows a flow chart of an exemplary development for the understanding of the embodiment of FIG. 1. As shown in FIG. 3, the flow chart includes:

S310: developing the test software.

S320: composing one or more test function(s). Each of the test function(s) is composed of at least one of one or more command(s) of an instrument.

S330: preparing the test software for supporting multiple communication protocols (e.g., protocol A, protocol B, and protocol C).

S340: preparing the test software for supporting multiple communication interfaces (e.g., interface A, interface B, and interface C).

S350: preparing the test software for supporting multiple instruments (e.g., instrument A, instrument B, instrument C, instrument D, and instrument E). Each of the multiple instruments adopts one of the multiple communication protocols mentioned in S330 and adopts one of the multiple communication interfaces mentioned in S340.

Figure 4:
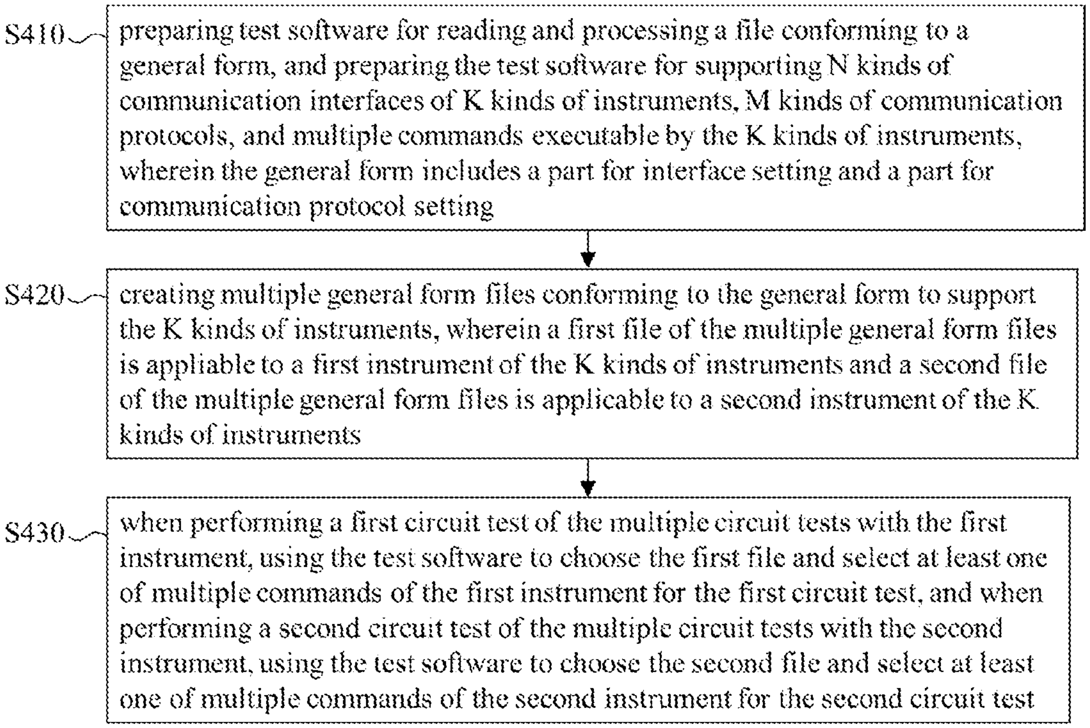
FIG. 4 shows another embodiment of the method of the present disclosure for performing multiple circuit tests with multiple instruments.

FIG. 4 shows another embodiment of the method of the present disclosure for performing multiple circuit tests with multiple instruments. In comparison with FIG. 1, the general form of the embodiment of FIG. 4 does not include the function list part, but the embodiment selects at least one of multiple commands for a function test when the function test is to be executed. The embodiment of FIG. 4 includes the following steps:

S410: preparing test software for reading and processing a file conforming to a general form, and preparing the test software for supporting N kinds of communication interfaces of K kinds of instruments, M kinds of communication protocols, and multiple commands

S430: when performing a first circuit test of the multiple circuit tests with the first instrument, using the test software to choose the first file and select at least one of multiple commands of the first instrument for the first circuit test, and when performing a second circuit test of the multiple circuit tests with the second instrument, using the test software to choose the second file and select at least one of multiple commands of the second instrument for the second circuit test.

Since those having ordinary skill in the art can refer to the embodiment of FIG. 1 to appreciate the detail and modification of the embodiment of FIG. 4, which implies that the feature(s) of the embodiment of FIG. 1 can be applied to the embodiment of FIG. 4 in a reasonable way, repeated and redundant description is omitted here.

Figure 5:
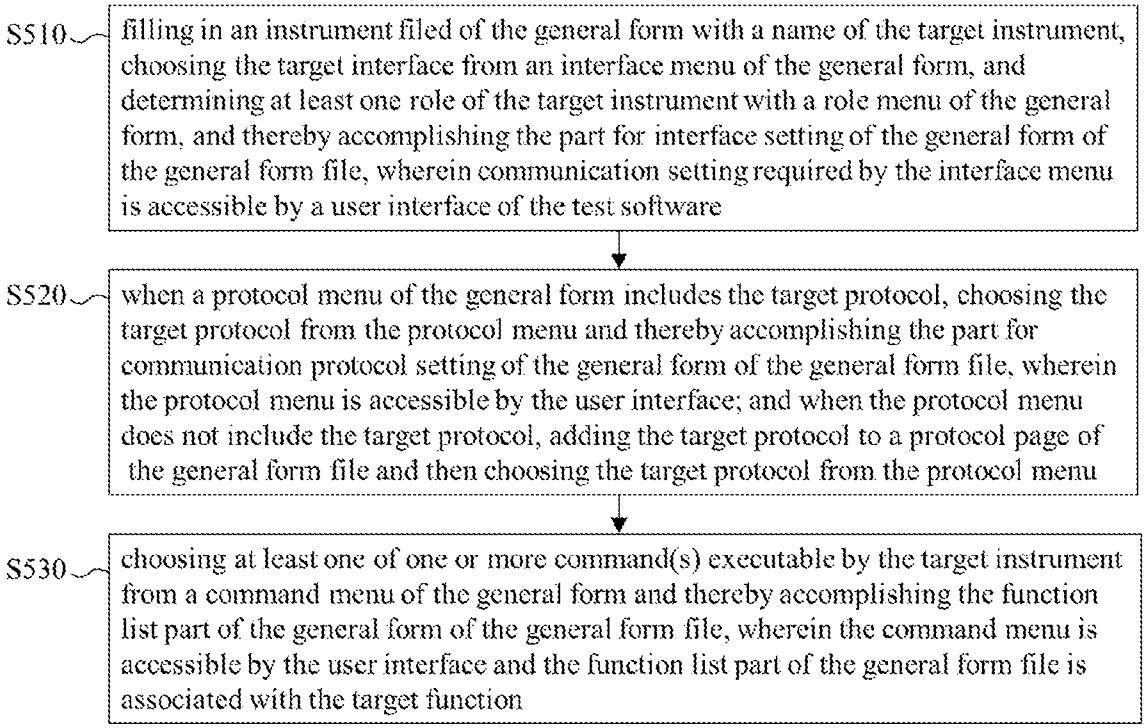
FIG. 5 shows an embodiment of the method of the present disclosure for creating a general form file conforming to a general form applicable to multiple instruments.

FIG. 5 shows an embodiment of the method of the present disclosure for creating a general form file conforming to a general form applicable to multiple instruments. Regarding the embodiment of FIG. 5: the general form file is for being read and processed by test software; the test software supports N kinds of communication interfaces of K kinds of instruments, M kinds of communication protocols, and multiple commands executable by the K kinds of instruments, wherein each of the N, the K, and the M is an integer greater than one; the general form file is used for supporting a target instrument of the K kinds of instruments, a target interface of the N kinds of communication interfaces, a target protocol of the M kinds of communication protocols, and a target function of the target instrument; and the general form includes a part for interface setting, a part for communication protocol setting, and a function list part. The embodiment of FIG. 5 includes the following steps:

S510: filling in an instrument filed of the general form with a name of the target instrument, choosing the target interface from an interface menu of the general form, and determining at least one role of the target instrument with a role menu of the general form, and thereby accomplishing the part for interface setting of the general form of the general form file, wherein communication setting required by the interface menu is accessible by a user interface of the test software.

S520: when a protocol menu of the general form includes the target protocol, choosing the target protocol from the protocol menu and thereby accomplishing the part for communication protocol setting of the general form of the general form file, wherein the protocol menu is accessible by the user interface; and when the protocol menu does not include the target protocol, adding the target protocol to a protocol page of the general form file and then choosing the target protocol from the protocol menu.

S530: choosing at least one of one or more command(s) executable by the target instrument from a command menu of the general form and thereby accomplishing the function list part of the general form of the general form file, wherein the command menu is accessible by the user interface and the function list part of the general form file is associated with the target function.

Since those having ordinary skill in the art can refer to the embodiment of FIG. 1 to appreciate the detail and modification of the embodiment of FIG. 5, which implies that the feature(s) of the embodiment of FIG. 1 can be applied to the embodiment of FIG. 5 in a reasonable way, repeated and redundant description is omitted here.

It is noted that people having ordinary skill in the art can selectively use some or all of the features of any embodiment in this specification or selectively use some or all of the features of multiple embodiments in this specification to implement the present invention as long as such implementation is practicable; in other words, the way to implement the present invention is flexible based on the present disclosure.

To sum up, the present invention can save the total time for the development of test software applicable to multiple kinds of instruments and can allow a user to operate the multiple kinds of instruments with the same test software.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A method for performing multiple circuit tests with multiple instruments, the method comprising:

preparing test software for reading and processing a file conforming to a general form, and preparing the test software for supporting N kinds of communication interfaces of K kinds of instruments, M kinds of communication protocols, and multiple commands executable by the K kinds of instruments, wherein the general form includes a part for interface setting, a part for communication protocol setting, and a function list part, and each of the N, the K, and the M is an integer greater than one;

creating multiple general form files conforming to the general form to support the K kinds of instruments, wherein a first file of the multiple general form files is applicable to a first instrument of the K kinds of instruments and a second file of the multiple general form files is applicable to a second instrument of the K kinds of instruments; and when performing a first circuit test of the multiple circuit tests with the first instrument, using the test software to choose the first file for the first circuit test, and when performing a second circuit test of the multiple circuit tests with the second instrument, using the test software to choose the second file for the second circuit test.

2. The method of claim 1, wherein the K is equal to or greater than each of the N and the M.

3. The method of claim 1, wherein the first file is applicable to the first instrument having a first interface of the N kinds of communication interfaces, using a first protocol of the M kinds of communication protocols, and being capable of executing a first function, and a step for creating the first file includes:

filling in an instrument filed of the general form with a name of the first instrument, choosing the first interface from an interface menu of the general form, and determining at least one role of the first instrument with a role menu of the general form, and thereby accomplishing the part for interface setting of the general form of the first file, wherein communication setting required by the interface menu is accessible by a user interface of the test software;

when a protocol menu of the general form includes the first protocol, choosing the first protocol from the protocol menu and thereby accomplishing the part for communication protocol setting of the general form of the first file, wherein the protocol menu is accessible by the user interface; and when the protocol menu does not include the first protocol, adding the first protocol to a protocol page of the first file and then choosing the first protocol from the protocol menu; and choosing at least one of multiple first commands executable by the first instrument from a command menu of the general form and thereby accomplishing the function list part of the general form of the first file, wherein the command menu is accessible by the user interface and the function list part of the first file is associated with the first function.

4. The method of claim 3, wherein the at least one role includes at least one of a scan terminal and a compare terminal.

5. A method for performing multiple circuit tests with multiple instruments, the method comprising:

preparing test software for reading and processing a file conforming to a general form, and preparing the test software for supporting N kinds of communication interfaces of K kinds of instruments, M kinds of communication protocols, and multiple commands executable by the K kinds of instruments, wherein the general form includes a part for interface setting and a part for communication protocol setting, and each of the N, the K, and the M is an integer greater than one;

creating multiple general form files conforming to the general form to support the K kinds of instruments, wherein a first file of the multiple general form files is applicable to a first instrument of the K kinds of instruments and a second file of the multiple general form files is applicable to a second instrument of the K kinds of instruments; and when performing a first circuit test of the multiple circuit tests with the first instrument, using the test software to choose the first file and select at least one of multiple first commands of the first instrument for the first circuit test, and when performing a second circuit test of the multiple circuit tests with the second instrument, using the test software to choose the second file and select at least one of multiple second commands of the second instrument for the second circuit test.

6. The method of claim 5, wherein the K is equal to or greater than each of the N and the M.

7. The method of claim 5, wherein the first file is applicable to the first instrument having a first interface of the N kinds of communication interfaces and using a first protocol of the M kinds of communication protocols, and a step for creating the first file includes:

filling in an instrument filed of the general form with a name of the first instrument, choosing the first interface from an interface menu of the general form, and determining at least one role of the first instrument with a role menu of the general form, and thereby accomplishing the part for interface setting of the general form of the first file; and when a protocol menu of the general form includes the first protocol, choosing the first protocol from the protocol menu and thereby accomplishing the part for communication protocol setting of the general form of the first file, wherein the protocol menu is accessible by a user interface; and when the protocol menu does not include the first protocol, adding the first protocol to a protocol page of the first file and then choosing the first protocol from the protocol menu.

8. The method of claim 7, wherein the at least one role includes at least one of a scan terminal and a compare terminal.

9. A method for creating a general form file conforming to a general form that is applicable to K kinds of instruments, wherein the general form file is for being read and processed by test software which supports N kinds of communication interfaces of the K kinds of instruments, M kinds of communication protocols, and multiple commands executable by the K kinds of instruments, wherein the general form file is applicable to a target instrument of the K kinds of instruments, a target interface of the N kinds of communication interfaces, a target protocol of the M kinds of communication protocols, and a target function of the target instrument, each of the N, the K, and the M is an integer greater than one, the general form includes a part for interface setting, a part for communication protocol setting, and a function list part, the method comprises:

filling in an instrument filed of the general form with a name of the target instrument, choosing the target interface from an interface menu of the general form, and determining at least one role of the target instrument with a role menu of the general form, and thereby accomplishing the part for interface setting of the general form of the general form file, wherein communication setting required by the interface menu is accessible by a user interface of the test software;

when a protocol menu of the general form includes the target protocol, choosing the target protocol from the protocol menu and thereby accomplishing the part for communication protocol setting of the general form of the general form file, wherein the protocol menu is accessible by the user interface; and when the protocol menu does not include the target protocol, adding the target protocol to a protocol page of the general form file and then choosing the target protocol from the protocol menu; and choosing at least one of one or more command(s) executable by the target instrument from a command menu of the general form and thereby accomplishing the function list part of the general form of the general form file, wherein the command menu is accessible by the user interface and the function list part of the general form file is associated with the target function.

10. The method of claim 9, wherein the at least a role includes at least one of a scan terminal and a compare terminal.

* * * * *